United States Patent [19]

Jesser

[11] Patent Number: 5,705,953
[45] Date of Patent: Jan. 6, 1998

[54] DEVICE BIAS BASED SUPPLEMENTAL AMPLIFICATION

[75] Inventor: Edward A. Jesser, Los Gatos, Calif.

[73] Assignee: Itron, Inc., Lakeville, Minn.

[21] Appl. No.: 658,224

[22] Filed: Jun. 4, 1996

[51] Int. Cl.$^6$ .................................................. H03F 1/30
[52] U.S. Cl. ................................... 330/290; 330/300
[58] Field of Search .............................. 330/288, 290, 330/300, 302, 296

[56] References Cited

U.S. PATENT DOCUMENTS 4,439,745  3/1984  Nakayana ..................... 330/290 X
4,663,599  5/1987  Patch ............................... 330/311
4,928,314  5/1990  Grandfield et al. ............. 455/236
5,329,249  7/1994  Cripps ............................ 330/302

*Primary Examiner*—Steven Mottola
*Attorney, Agent, or Firm*—Kinney & Lange, P.A.

[57] ABSTRACT

An amplifier having a current determiner to provide an operating current depending on a reference current, the operating current being used to operate an input amplifying device. The output of the input amplifying device is further amplified by one or more devices in the current determiner. The current determiner has a pair of matched devices used to set the output current in response to the supplied reference current.

16 Claims, 6 Drawing Sheets

DEVICE BIAS BASED SUPPLEMENTAL AMPLIFICATION

BACKGROUND OF THE INVENTION

The present invention relates to signal amplifiers based on active circuit biased active electronic devices and, more particularly, to such signal amplifiers usable with RF signals.

In recent times, there has been a rapid growth in communication systems based on transmitting RF signals between transmitters and receivers in such systems. Such communication systems include telephone and cable systems using RF links, satellite based transmission systems, cellular telephones, etc. In most instances, the RF signals received at a signal receiver from a transmitter require amplification before signal processing is undertaken with respect to those signals to recover the information contained therein. Furthermore, in many of those signal receivers, or in the monolithic integrated circuits used therein, space in which to provide such amplifiers is often quite limited.

Such RF amplifiers should stably maintain their operating characteristics during use to provide repeatable amplification characteristics for the signals supplied thereto for amplification. Thus, bipolar junction transistors, junction field-effect transistors, or metal-oxide-semiconductor (MOS) field-effect transistors typically used therein require being operated with a stable operating current to maintain constant input and output impedance parameters. In addition, the input and output RF signals must be efficiently coupled into and out of such amplifiers from the circuits provided before and after the amplifiers to obtain the full value of the amplification provided. Thus, there is a desire for a stable, compact RF amplifier which can efficiently amplify RF signals provided thereto for use in subsequent signal processing circuits.

SUMMARY OF THE INVENTION

The present invention provides an amplifier having a current determining arrangement based on a reference current supplied thereto to set the value of the output current therefrom that is conducted through an input signal receiver. The current determining arrangement has a plurality of gain devices such as transistors electrically interconnected in a determiner circuit through at least one of which the reference currents are conducted and through at least one of which the output currents are conducted with a magnitude as set by the magnitude of the corresponding reference current with one of these gain devices having an output electrically connected to the amplifier output. An input signal receiver has an amplifying device such as a transistor through which, at least in part, the current determining arrangement output currents are conducted. This amplifying device has an input electrically coupled to the amplifier input and an output electrically connected to the input of one of the plurality of gain devices. Thus, input signals at the amplifier input can be amplified by the input signal receiver amplifying device and by at least one of the gain devices.

DETAILED DESCRIPTION OF THE PREFERRED EMBODIMENTS

The input electronic amplifying device used at the very input of a signal amplifier for amplifying electronic signals typically must operate in a carefully designed, stable circuit. This amplifying device will be amplifying the smallest magnitude version of the signal intended to be amplified present in the amplifier since subsequent amplification devices in that amplifier will benefit from the amplification based increasing magnitudes of each signal version that is provided by the preceding amplification devices. Thus, the input amplifying device must have a stable operating current provided therethrough because the impedance parameters characterizing that device, and so the interaction of that device with the other circuit components connected thereto, depend on the magnitude of that operating current. In the present invention, this is accomplished by using a "current mirror" circuit operated from a stable source of reference current to provide an output current "mirroring" this reference current which is thus also quite stable to thereby provide the operating current for an input electronic amplifying device.

Typically, though, the amplification provided by the input amplifying device by itself is insufficient for the needs of the subsequent signal processing circuitry so that subsequent amplifying devices are required in the amplifier. If the amplifier is being built in a monolithic integrated circuit, such as a microwave monolithic integrated circuit, or in a hybrid integrated circuit, the provision of additional amplification devices in forming the amplifier will consume costly surface area in such circuits. This need is avoided to a significant extent in the present invention by using the active devices in the current mirror circuit to also provide amplification of the input signal after it has been first amplified by the input amplifying device.

Figure 1:
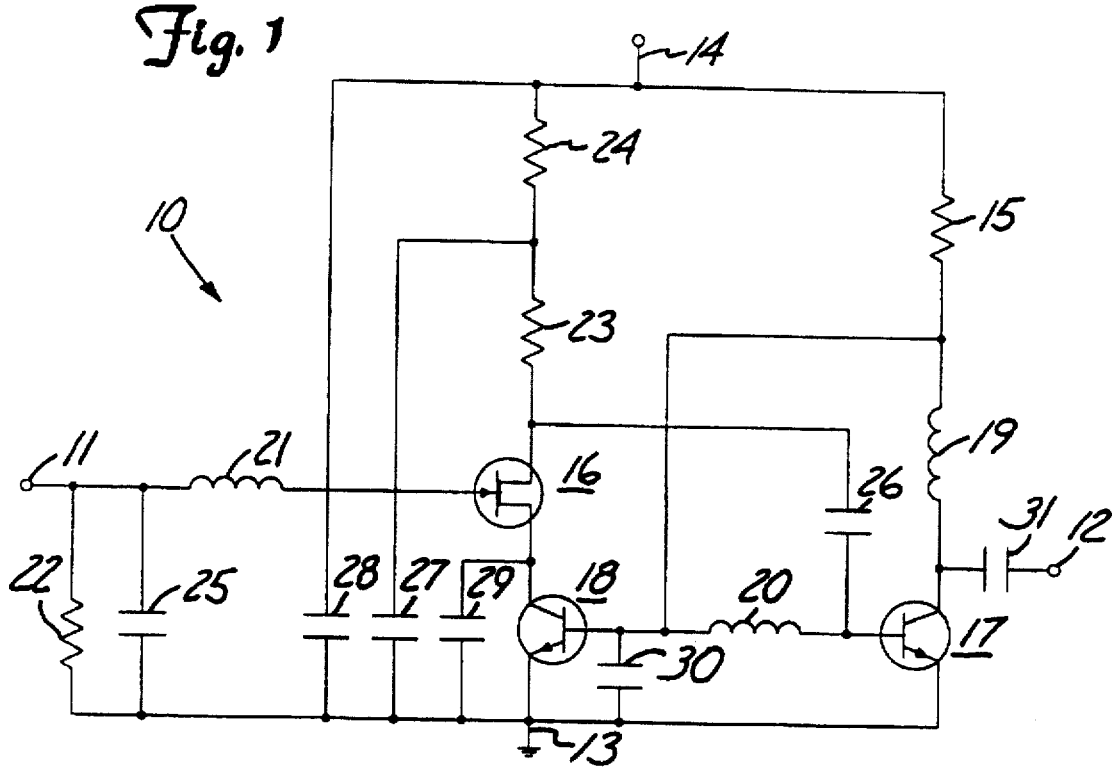
FIG. 1 shows an electrical schematic diagram of a circuit embodying the present invention.

A first embodiment of the present invention is shown in the electrical schematic diagram of an electronic circuit for such an amplifier, 10, that is set out in FIG. 1. The amplifier input, 11, is shown on the left of the circuit in FIG. 1 with the amplifier output, 12, shown on the right. The amplifier circuit is typically operated by a well-regulated, positive voltage supply having a ground terminal connected to a ground reference interconnection, 13, in amplifier 10, and having a positive voltage supply terminal connected to a positive supply interconnection, 14, in amplifier 10. The reference current for the current mirror is then determined by the magnitude of this regulated positive voltage provided at interconnection 14 and the resistance value of a current magnitude setting resistor, 15, connected to interconnection 14.

Alternatively, the interconnection between resistor 15 and interconnection 14 may be omitted, and a well-regulated current source may be substituted for resistor 15 to provide the desired reference current. The circuit of FIG. 1 and the remaining circuits will be described assuming the reference current is provided by a current magnitude setting resistor and a regulated voltage supply, but the use of a different regulated current source instead is an option.

Input 11 of amplifier 10 is connected through some circuitry to an input amplifying device, 16, provided by a n-channel, depletion mode metal-semiconductor field-effect transistor (MESFET) formed of GaAs semiconductor material. Such an input amplifying device is chosen because of its low noise figure to avoid corrupting the very small magnitude input signals, its substantial gate input impedance to avoid loading the external signal source, and its wide operating bandwidth for use in amplifying radio frequency signals assumed to be provided by this source. However, amplifier 10 can be designed to amplify much lower frequency signals if desired while still achieving the same compactness in its fabrication. Depending on the frequency bandwidth desired for the amplifier and other factors, alternative transistor structures can be used for input amplifying device 16 including those based on silicon semiconductor material.

In the absence of an external source signal being provided at input 11 for transistor 16, the currents in amplifier 10 will be substantially constant direct currents. The operating current for transistor 16 is intended to be a constant direct current that is set in magnitude by a pair of "current mirroring" npn bipolar transistors, 17 and 18. These two bipolar transistors must be fabricated together as a matched pair to provide the best circuit performance and, as will be seen below, must have sufficiently wide bandwidths to be capable of amplifying signals at the frequencies present in the amplifier input signals. The reference current supplied from resistor 15 splits at the junction of that resistor and an inductor, 19, connected between that junction and the collector of transistor 17. One part of this split current follows an interconnection path also connected to this junction of resistor 15 and inductor 19 to conduct that current portion to the base of transistor 18 and, through a further inductor, 20, to the base of resistor 17. The remaining portion of the split current is conducted by inductor 19 to the collector of transistor 17. The resistances of inductors 19 and 20 to fixed constant currents is quite low to result in very little constant direct voltage drops thereacross for these currents.

Because of the gain of bipolar transistor 17, only a slight current will be drawn by the base of transistor 17 through inductor 20 with most of the remaining current being drawn by the collector of transistor 17 through inductor 19 in a ratio determined by essentially the gain characteristic of transistor 17. Transistor 17 is connected to behave much as a diode in view of its base essentially being shorted to its collector because of the low resistance values to constant direct currents of inductors 19 and 20.

Since bipolar transistor 18 is typically fabricated concurrently with bipolar transistor 17 to obtain a good match (although careful selection for matching of two independent bipolar transistors is also a possibility), the input impedance characteristics and the gain characteristics of each of these transistors will closely match those of the other. In view of this close match between these characteristics of transistors 17 and 18, and because of the very low resistance of inductor 20 to constant direct current, the resulting current drawn at the collector of transistor 18 will be closely similar to that drawn at the collector of transistor 17. Also because of these well matched characteristics, the slight difference in base current drawn by transistor 17 compared to transistor 18, due to inductor 20, will still result in the current drawn at the collector of transistor 17 being substantially a fixed fraction of that drawn at the collector of transistor 18.

These currents drawn at the bases and collectors of transistors 17 and 18 are conducted to ground interconnection 13 since the emitters of each of these transistors are directly connected thereto. Alternatively, resistors can be connected to ground from one or both of the emitters of bipolar transistors 17 and 18 (using a capacitor to bypass any resistor used in the emitter circuit of transistor 17 to keep it from affecting the radio frequency signals amplified by that transistor). Such emitter resistors, through the selection of the resistance values therefor, permits choosing a different value than substantially one for the ratio of the "current mirror" circuit output current magnitude to the magnitude of the reference current supplied to that circuit, and any such resistors used in the emitter circuits also provide an effective increase in the output impedance of the transistor collector circuits at the collectors. In a further alternative, the geometrical dimensions or the number of emitters of transistors 17 and 18 can be altered to obtain a corresponding altering of the ratio between the circuit output and reference currents.

The current drawn at the collector of transistor 18 is supplied from the source of MESFET transistor 16, and serves as a stable operating current for transistor 16. The source of transistor 16 is at a substantially constant voltage above the voltage on ground reference 13 by the amount of the voltage drop between the collector and emitter of bipolar transistor 18. Since the gate of transistor 16 has a direct current path to ground at interconnection 13 through a further inductor, 21, and a resistor, 22, transistor 16 has the Schottky barrier junction therein properly reversed biased for operation in the saturation region.

The operating current drawn at the source of MESFET 16 by bipolar transistor 18 is supplied to the drain of MESFET 16 through a pair of resistors, 23 and 24. Resistor 24 is connected to positive voltage interconnection 14 and then connected at the opposite end thereof to resistor 23. The opposite end of resistor 23 is connected to the drain of MESFET 16. The substantially constant voltage appearing on the drain of MESFET 16 is equal to the voltage at positive voltage supply interconnection 14 less the product of the operating current for MESFET 16 and the sum of the resistance values for resistors 23 and 24.

The provision of a varying signal from an external source on input 11 of amplifier 10 results in the addition of varying currents and voltages in the circuit of amplifier 10 to the just described substantially constant currents and voltages established therein due to the provision of a positive regulated voltage between interconnections 14 and 13 in the absence of such a varying input signal. A typical external source for such a varying signal at input 11 will be one exhibiting in effect a 50 Ω source impedance such as an antenna. In the present example, this source will be a radio frequency source that generates signals varying at frequencies around 1.0 GHz.

Combining the resistance of gate resistor 22, connected between input 11 and ground interconnection 13 across any external source, with the external source impedance yields the effective source impedance at input 11. A capacitor, 25, connected in parallel with resistor 22, is also connected by inductor 21 to the gate of MESFET 16 to form together a L-section tuned impedance matching network. This network serves between the low effective source impedance and the high gate impedance of MESFET 16 so that the impedance of function of one appears to be the complex conjugate of the other at the frequencies of the signals provided by the external source ("impedance matching").

MESFET 16 amplifies the signals applied at the gate thereof to result in corresponding output signals provided at the drain thereof where connected to resistor 23. From there, these output signals of MESFET 16 are coupled via a capacitor, 26, to the base of bipolar transistor 17 for further amplification. Thus, as indicated above, transistor 17 must be capable of also operating over a sufficiently wide bandwidth to accommodate the frequency range of the input signal. Capacitor 26 couples just the radio frequency output signal at the drain of MESFET 16 to the base of transistor 17, and blocks any constant value direct current from flowing between that drain and base. As a result, a significant underlying constant voltage drop develops thereacross in view of the different voltage potentials at these two circuit points.

The output signal of MESFET 16 is developed across resistor 23, as the radio frequency signal load resistor therefor, rather than across both resistor 23 and resistor 24. This is because of the presence of a radio frequency bypass capacitor, 27, connected between ground interconnection 13 and the junction of resistors 23 and 24. This capacitor, and the provision of a further capacitor, 28, across the positive voltage supply through its being connected from interconnection 14 to interconnection 13, assures that resistor 24 and the positive voltage supply are both fully bypassed by the output radio frequency signals of MESFET 16. A further capacitor, 29, from the source of MESFET 16 to ground interconnection 13 fully bypasses transistor 18 also for radio frequency signals amplified by MESFET 16 appearing at its emitter. This leaves resistor 23 to be the radio frequency signal load impedance in the output circuit of MESFET 16.

As a result, an approximately 50 Ω load resistance value can be provided to these output signals as the output load impedance by choosing that resistance value for resistor 23 despite the need for a greater load resistance for the constant current portion of the output current of MESFET 16 as is provided by resistor 24. This circuit arrangement means that the radio frequency output circuit of MESFET 16 is not fully matched in impedance with the radio frequency input circuit for transistor 17 thereby causing some reduction in signal transfer from what could otherwise be achieved. This relinquishing of maximum signal transfer at the output of MESFET 16 is done to improve the circuit stability of MESFET 16 by reducing the possibilities for unintended feedback from its output circuit to its input circuit. Such impedance matching in the MESFET 16 output circuit could be achieved, if instead desired, through the substitution of an inductor for resistor 23 to thereby form with capacitor 26 another L-section tuned impedance matching network.

Capacitor 26 and inductor 20 together form another L-section tuned impedance matching network to match the impedance of the output circuit at the drain of MESFET 16 to the input circuit at the base of bipolar transistor 17. This match is furthered by the presence of a another radio frequency signal bypass capacitor, 30, connected between the base of transistor 18 and ground interconnection 13 to in effect short, for radio frequency signals, the end of inductor 20 connected thereto to ground interconnection 13.

A final impedance match is needed to efficiently transfer signals from the output of bipolar transistor 17 as the second amplifying device to the amplifier external load circuit to be connected to output 12 thereof. Various impedance matching networks can be used so long as a direct current path is maintained between resistor 15 and the collector of transistor 17, and so nearly any external output load impedance could be matched to the impedance in the collector circuit of transistor 17 as desired. To this end, the circuit arrangement shown in FIG. 1 has a further L-section tuned impedance matching network formed of inductor 19 along with a further capacitor, 31, connected between the collector of transistor 17 and output 12. This arrangement assumes the load impedance to be significantly lower than the output impedance of transistor 17 output circuit, the external load in a typical situation also having a magnitude of 50 Ω. Note that while the collector and the base of bipolar transistor 17 are effectively shorted together for constant direct currents because of the low resistance values of inductors 19 and 20 to such currents, they are not shorted together for radio frequency signals because of the much higher impedances presented by those inductors to such signals. This situation allows significant radio frequency signals to develop at the collector of transistor 17 with respect to those provided to the base thereof. This impedance separating the base and collector of transistor 17 can be increased by substituting a resistor of moderate resistance value between resistor 15 and the base of transistor 18 to permit a larger radio frequency signal to occur at the collector without significantly changing the constant direct currents in the circuit.

Note that ceramic resonators can be used in place of one or more of the inductors in the circuit of amplifier 10 if desired, such as inplace of inductors 19 and 20. Such resonators will operate as inductors for signals therethrough having frequencies corresponding to wavelengths that are less than a quarter wavelength for the resonance frequency of such resonators. Also note that substantial portions of the circuit shown in FIG. 1 outside of MESFET 16 could be formed in a silicon based monolithic integrated circuit to improve matching and reduce cost, including the use of silicon field-effect transistors in place of the bipolar transistors. Further possibilities include arranging the circuit to allow use of GaAs transistors for the silicon bipolar transistors, and to form a GaAs based monolithic integrated circuit.

Some typical component values for the circuit components used in amplifier 10 is shown in FIG. 1 for the frequency of the signals indicated above are set out in the following:

| SYMBOLS | VALUES |
| --- | --- |
| Resistors: | |
| $R_{15}$ | 680 Ω |
| $R_{22}$ | 10 kΩ |
| $R_{23}$ | 51 Ω |
| $R_{24}$ | 270 Ω |
| Inductors: | |
| $L_{19}$ | 15 nH |
| $L_{20}$ | 13 nH |
| $L_{21}$ | 9.2 nH |
| Capacitors: | |
| $C_{25}$ | 1 pF |
| $C_{26}$ | 1 pF |
| $C_{27}$ | 33 pF |
| $C_{28}$ | 33 pF |
| $C_{29}$ | 33 pF |
| $C_{30}$ | 33 pF |
| $C_{31}$ | 3.3 pF |

Figure 2A:
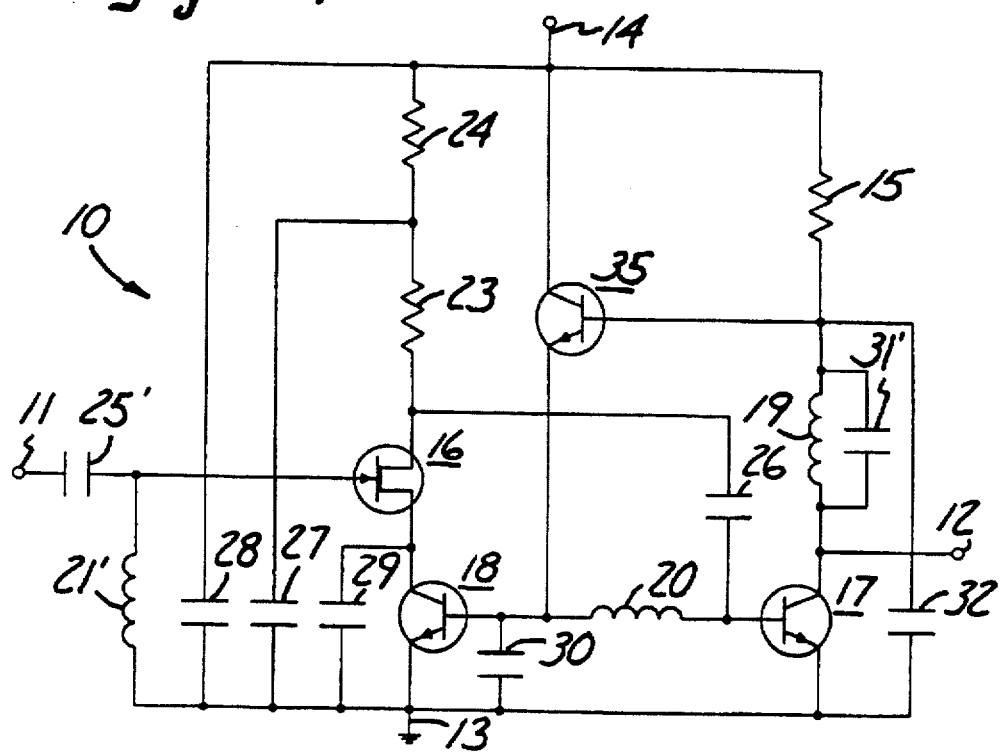
FIGS. 2A and 2B show electrical schematic diagrams of alternative circuits embodying the present invention.

An alternative embodiment of the invention is shown in the electrical schematic diagram of FIG. 2A of a circuit which is essentially the same as that in the embodiment of FIG. 1 except for substituting a further npn bipolar transistor, 35, between the base of transistor 18 and the junction of resistor 15 and inductor 19. The base of transistor 35 is connected to the junction of resistor 15 and inductor 19, the emitter of transistor 35 is connected to the base of transistor 18, and the collector of transistor 35 is connected to positive voltage interconnection 14. The presence of transistor 35 allows a more precise matching of the reference current supplied from resistor 15 by the operating current for MESFET 16 drawn at the collector of transistor 18 (or by this operating current as weighted by the desired ratio between it and the reference current). This comes about because there is a smaller portion of the reference current supplied by resistor 15 split away to the bases of transistors 17 and 18 due to the current gain provided by transistor 35. Transistor 35 in the circuit of FIG. 2A is only important to the constant direct currents flowing in that circuit in the absence of a signal at input 11, as transistor 35 takes no direct role with respect to radio frequency signals occurring in that circuit.

Another change is in the reconfiguration of the output circuit at the collector of transistor 17 based on assuming in this instance that the external load impedance is of a large magnitude rather than the relatively small magnitude assumed in connection with the description of the circuit of FIG. 1. As a result, capacitor 31, rather than extending from the collector of transistor 17 to output 12, now extends from the collector of transistor 17 to the other side of inductor 19 to thereby provide a parallel resonant circuit exhibiting a high impedance at the primary frequency of the signals from the external signal source applied to input 11. Thus, capacitor 31 is redesignated in the circuit of FIG. 2A as 31'. A direct connection is instead provided from the collector of transistor 17 to amplifier 12.

A further change in the amplifier 10 circuit shown in FIG. 2A involves omitting gate resistor 22, interchanging the positions of capacitor 25 and inductor 21 in the circuit of FIG. 2A from the positions they had in the circuit of FIG. 1. The result is shown in the circuit of FIG. 2A with this capacitor, redesignated 25' in that figure, now connected in series with the gate of MESFET 16 and this inductor, redesignated 21', connected between the gate of that transistor and ground reference interconnection 13. Connected so, inductor 21' in addition to its contribution to impedance matching also provides a direct current path to ground reference 13 from the gate of MESFET 16 to replace the path removed by the omission of resistor 22. The result is to provide a different L-section tune matching impedance circuit, but one that yet allows matching of the impedance of the external source with the impedance at the gate of MESFET 16.

One further change is the addition of a further capacitor, 32, connected between ground reference interconnection 13 and the junction of resistor 15 and inductor 19. In the circuit of FIG. 1, the direct connection between the base of transistor 18 and the junction of resistor 15 and inductor 19 allowed radio frequency signal bypass capacitor 30 to not only effectively short inductor 20 to ground at radio frequency signals, so that inductor and capacitor 26 could provide a proper impedance matching network in the input of transistor 17, but that capacitor also effectively shorted inductor 19 to ground for radio frequency signals. This also permitted inductor 19 and capacitor 31 to operate as a proper impedance matching network in the output circuit of transistor 17.

Because of the interposing of transistor 35 in the circuit of Figure 2A, capacitor 30 in that circuit aids only the impedance matching network formed of inductor 20 and capacitor 26 in the input circuit of transistor 17 to provide a proper impedance match. Thus, capacitor 32 has now been added so that the resonant circuit formed of inductor 19 in capacitor 31' provides the output load at radio signal frequencies for transistor 17. Capacitor 32 so connected provides a shunt bypass of resistor 15 at radio frequency signals for this purpose, and also serves to shunt noise signals away from the base of transistor 35 to ground interconnection 13.

Figure 2B:
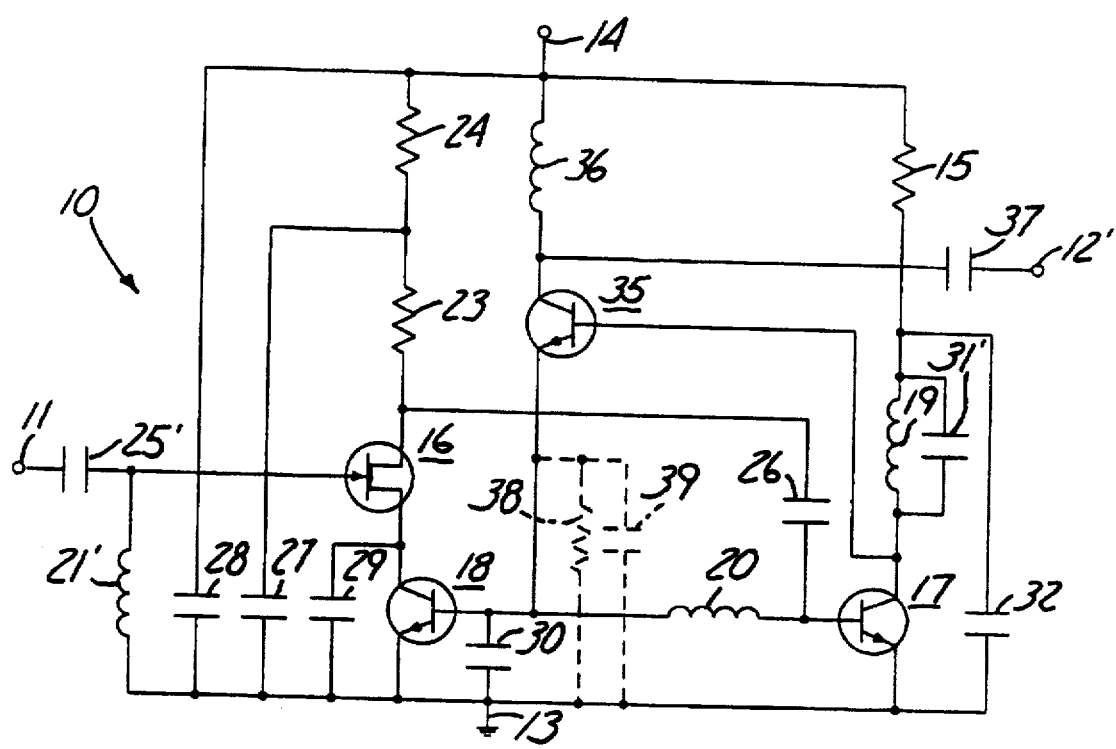

Substantially the same circuit used in FIG. 2A is shown in FIG. 2B but with modifications to allow further amplification by bipolar transistor 35 of radio frequency signals before providing them at the output of amplifier 10. This is accomplished by changing the connection of the base of transistor 35 to the collector of transistor 17 in FIG. 2B rather than having that base connected to the junction of resistor 15 and inductor 19 as in the circuit of FIG. 2A. As a result, the output signal of transistor 17 at its collector is directed to the base of transistor 35 for further amplification by that transistor. This requires transistor 35 to now have a bandwidth sufficient to also be capable of amplifying signals having the frequency content of the input signals supplied by the external source.

An inductor, 36, is connected between the collector of transistor 35 and positive voltage interconnection 14 to provide the collector load for transistor 35. The small constant current impedance of inductor 36 leaves essentially unaltered the constant current supplied to the collector of transistor 35. The output signal for amplifier 10 is then taken at the collector of transistor 35 through an output capacitor, 37, connected therefrom to the amplifier output which is designated as 12' in FIG. 2B. Inductor 36 and capacitor 37 again form a L-section tuned matching impedance network permitting the impedance of an external load connected to output 12' to be matched to the circuit impedance of the of the transistor 35 collector circuit. Here, a relatively small output load impedance is again assumed.

Because the current drawn at the emitter of transistor 35 by the bases of transistors 17 and 18 is quite small, the collector current drawn through transistor 35 is also quite small leading to a relatively narrow bandwidth over which that transistor can operate. If the frequency content of signals from the external source applied to input 11 of amplifier 10 have a frequency content over a sufficiently wide bandwidth, the operating bandwidth of transistor 35 may be insufficient at such small collector currents. Since this operating bandwidth of that transistor depends on the magnitude of the collector current drawn therethrough, this bandwidth can be increased by increasing the collector current through the addition of a resistor, 38, connected between the emitter of transistor 35 and ground reference interconnection 13. This resistor shown as a dashed line option in FIG. 2B. Again, this resistor must be bypassed by a capacitor, 39, also shown in dash line form in FIG. 2B, to keep it from affecting the radio frequency signals being amplified by transistor 35.

Rather than providing an output signal for amplifier 10 from the collector of transistor 35, the signal amplified by transistor 35 could be supplied to transistor 18. Isolating transistor 18 from MESFET 16 at radio frequencies would permit the output instead could be taken from the collector of transistor 18 to thereby provide four stages of amplification for radio frequency signals in the circuit of FIG. 2B.

Figure 3A:
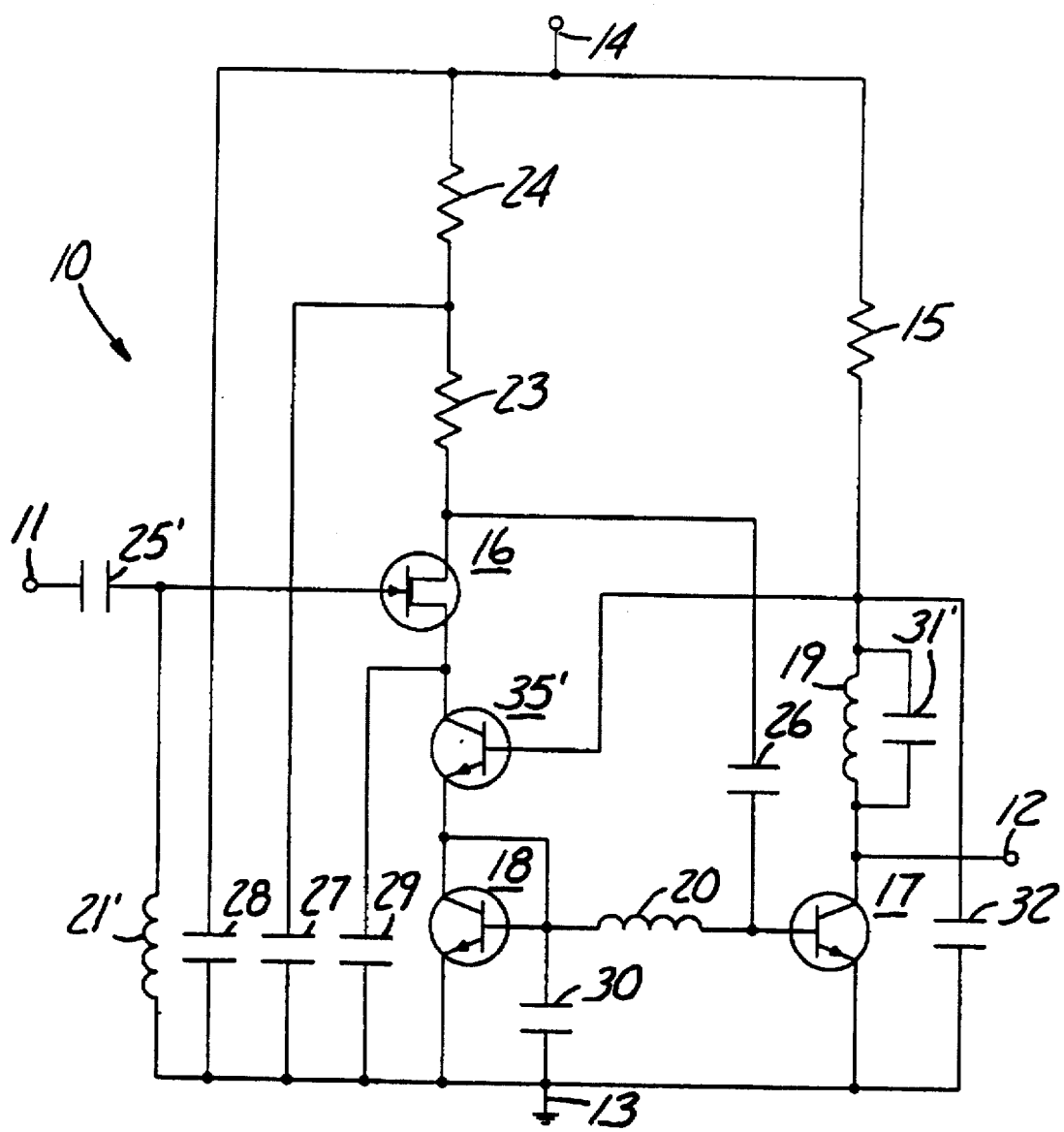
FIGS. 3A, 3B and 3C show electrical schematic diagrams of other alternative circuits embodying the present invention.

FIG. 3A provides an electrical schematic diagram showing a further circuit that appears in that diagram to be much like that of the circuit shown in FIG. 2A except for the location of transistor 35. In the circuit of FIG. 2A, transistor 35 supplies current to just the bases of transistors 17 and 18. However, in FIG. 3A, this transistor, which has been redesignated 35' in that figure, is located in the collector circuit of transistor 18. The collector of transistor 18 is directly connected to the base thereof to form a short circuit therebetween. As a result, the emitter current of transistor 35' again supplies current to the bases of transistors 17 and 18 as did transistor 35 in FIG. 2A, but also supplies the collector current to transistor 18. Again, because of the gain of transistor 35', the base current drawn thereby splits very little of the reference current supplied by resistor 15 away from inductor 19 in the collector of transistor 17.

However, the effective output impedance of the "current mirror" circuit taken at the collector of transistor 35' is significantly higher than that taken at the collector of transistor 18 in FIGS. 2A and 2B because of the presence of transistor 18 in the emitter circuit of transistor 35' and the negative feedback loop established through transistor 35' and transistors 18 and 17 back to the base of transistor 35'. This provides an effective increase the output impedance at the collector of transistor 35' to thereby provide a more effective sink for the operating current dram by transistor 35' through MESFET 16.

Radio frequency signals introduced by an external source at input 11 of amplifier 10 are again amplified by MESFET 16 and transmitted through capacitor 26 to the base of transistor 17. Those signals are further amplified by transistor 17 and provided at its collector to output 12 of amplifier 10. Thus, the radio frequency signals in the circuit of FIG. 3A are amplified in the same manner as they are in the circuit of FIG. 2A.

Figure 3B:
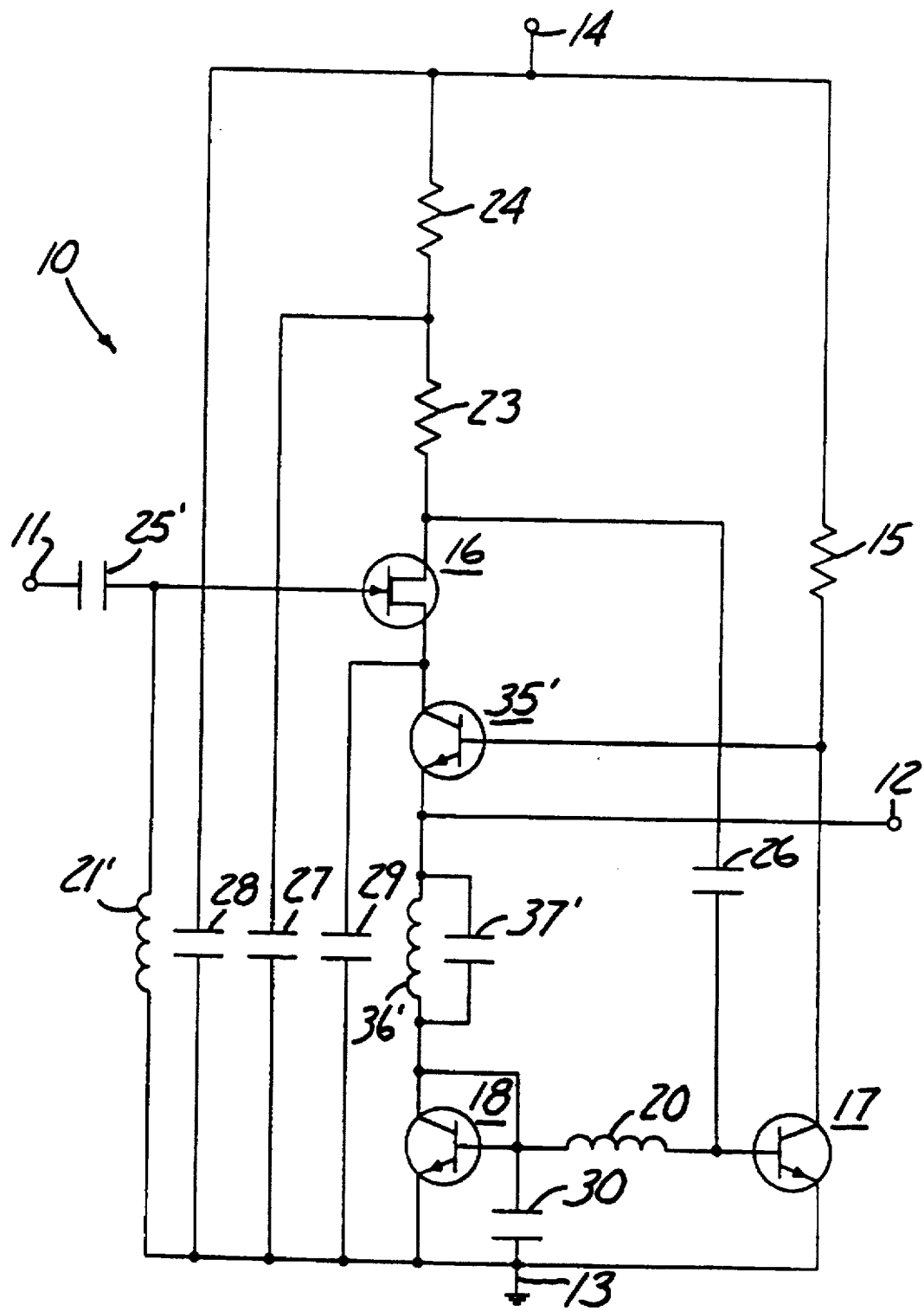
Figure 3C:
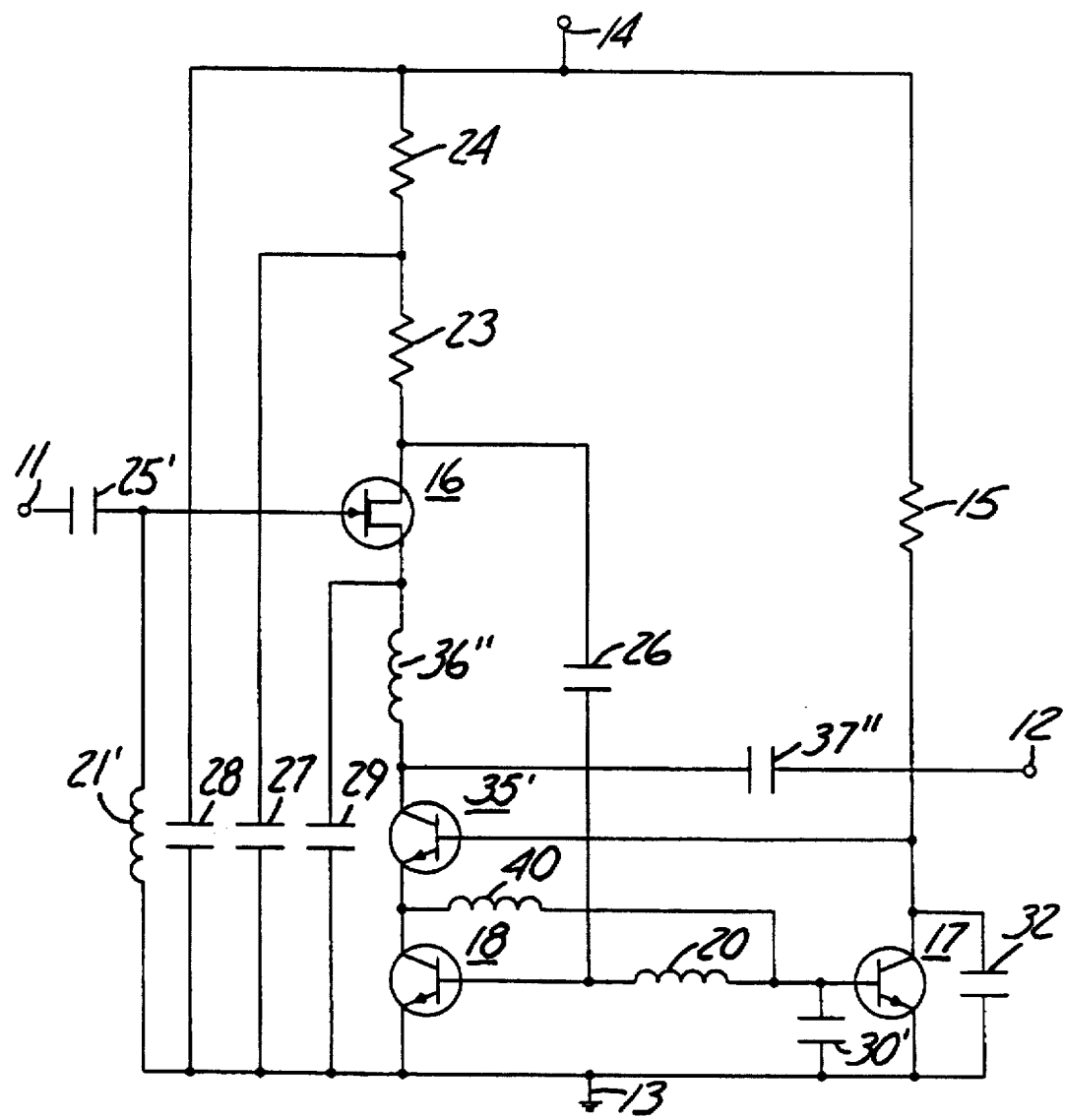

The circuits shown in the electrical schematic diagrams of FIGS. 3B and 3C operate in the absence of signals at input 11 with essentially the same constant currents and voltages therein as occur in the circuit of FIG. 3A in the same conditions. The introduction of radio frequency signals at input 11 by an external source results in the same amplification being provided by MESFET 16 and bipolar transistor 17 as was provided in the circuit of FIG. 3A, except the load in the collector circuit of transistor 17 is now provided by reference current resistor 15 because the circuits of FIGS. 3B and 3C are intended for use at much lower frequencies. At sufficiently low frequencies, resistor 15 provides an adequate load and adequate isolation from the positive voltage supply connected to terminal 14 for radio frequency signals occurring at the collector of transistor 17. Thus, to this point, the circuits of FIGS. 3B and 3C are alternatives that could be used at lower frequencies than those with which the circuit of FIG. 3A can be used.

However, as in the circuit of FIG. 2B, the output signal from bipolar transistor 17 at its collector is also introduced into the base of bipolar transistor 35' for further amplification in both of these circuits. (For use at higher frequencies, the circuits of FIGS. 3B and 3C would need a parallel resonant circuit connected to resistor 15 and the base of transistor 35' in place of the short circuit shown in these figures along with a bypass capacitor from resistor 15 and the resonant circuit to ground reference 13.) In the circuit of FIG. 3B, the output signal for amplifier 10 is taken at the emitter of transmitter 35' rather than at the collector of that transistor as in the circuit of FIG. 2B. Hence, the tuned matching impedance provided by inductor 36 and capacitor 37 in FIG. 2B becomes, instead, in the circuit of FIG. 3B, a parallel resonant circuit to provide radio frequency signal isolation between the emitter of bipolar transistor 35' and the collector of bipolar transistor 18. As a result, these components are redesignated in the circuit of FIG. 3B as 36' and 37'. The result is that the output signal from amplifier 10 is provided by transistor 35' operating as an emitter follower to thereby provide a low output impedance for amplifier 10. Should a high output impedance be desired instead for the circuit of FIG. 3B, the output could alternatively be taken at the collector of transistor 35' with the parallel resonant circuit formed of inductor 36' and capacitor 37' being provided between the collector of transistor 35' and the source of MESFET 16. There, this parallel resonant circuit provides the load for the output radio frequency signals from transistor 35' and isolate that transistor from MESFET 16.

Such a high output impedance arrangement for amplifier 10 at the collector of transistor 35' can be seen in FIG. 3C which would remain at a high impedance if inductor 36' and capacitor 37' in the parallel resonant circuit in FIG. 3B were shifted to the collector of that transistor. Here, however, a L-section tuned impedance matching network is provided at the collector of transistor 35' by an inductor, redesignated 36", connected between the source of MESFET 16 and the collector of transistor 35', and a capacitor, redesignated 37", connected between the collector of transistor 35' and output 12. This arrangement allows matching of the amplifier output impedance to a low impedance load at output 12.

However, the circuit of FIG. 3C has the intermediate amplification step provided by bipolar transistor 18 rather than by bipolar transistor 17. This is accomplished by connecting capacitor 26 to the base of transistor 18 in FIG. 3C rather than to the base of transistor 17 as in FIG. 3B, and by moving bypass capacitor 30 in FIG. 3B. That capacitor, redesignated in the FIG. 3C circuit as 30', is connected in that circuit between the base of transistor 18 and ground reference 13 rather than being connected between the base of transistor 17 and ground reference 13 as in FIG. 3B.

Again, inductor 20 and a further inductor, 40, are used to effectively short the base of transistor 18 to the collector thereof for constant currents, but to also permit an impedance difference between the base and collector of that transistor at radio frequency frequencies as was done in the circuits of FIGS. 1 and 2A. MESFET 16 provides its output signals through capacitor 26 to the base of transistor 18 which in turn provides output signals at its collector to the emitter of transistor 35'. As a result, transistor 35' appears as a common base amplifier for radio frequency signals, and provides these signals at its collector with a high impedance. These signals are then coupled to output 12 of amplifier 10 to provide the output signal of the amplifier with a high output impedance but which through matching, as indicated above, can be operated with a low impedance external load connected to output 12.

Figure 4:
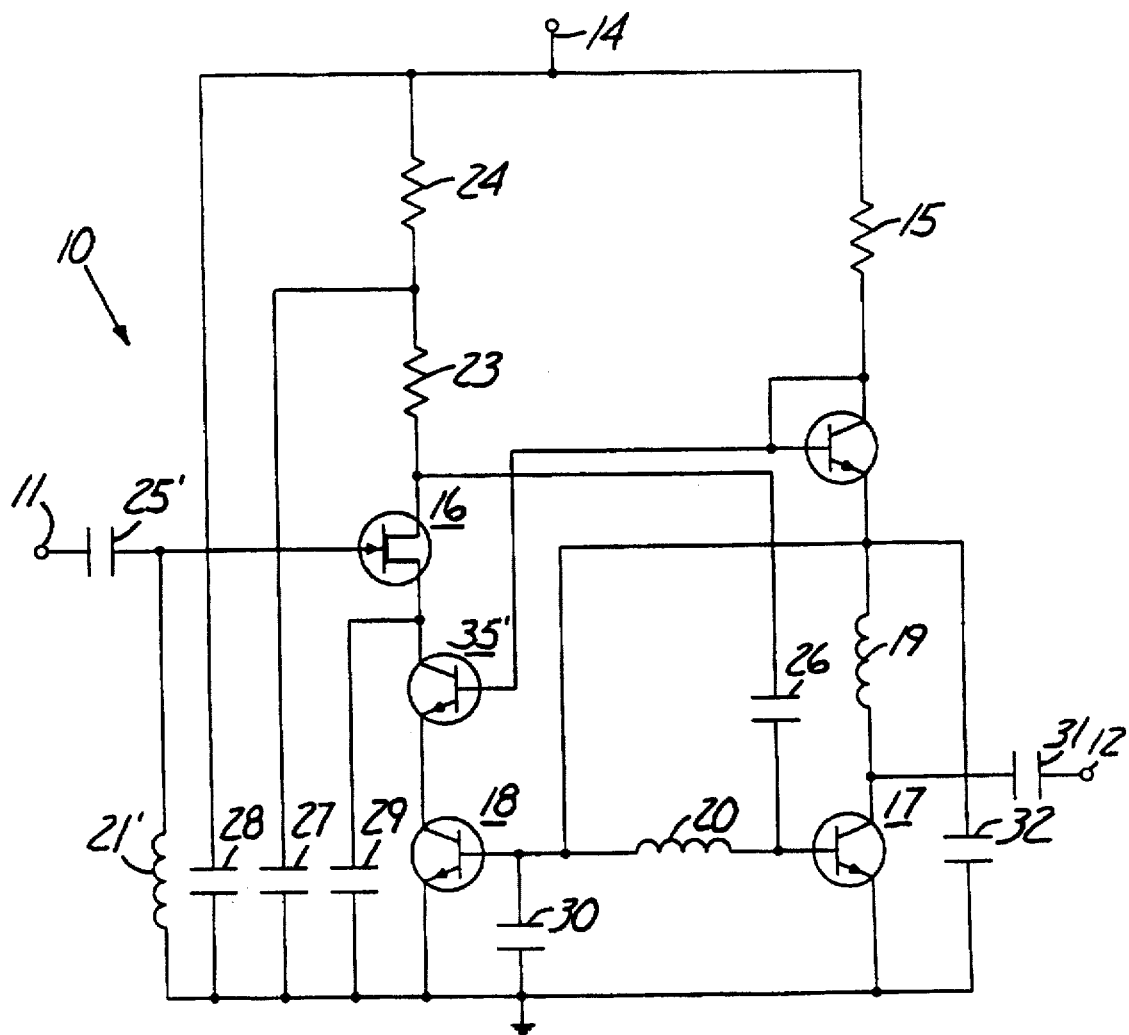
FIG. 4 shows an electrical schematic diagram of a further alternative circuit embodying the present invention.

A further circuit is shown in the electrical schematic diagram of FIG. 4 for amplifier 10 also providing a significant impedance increase at the collector of bipolar transistor 35', drawing operating current through MESFET 16, to again provide a more effective sink for that operating current. This is accomplished in the circuit of FIG. 4 by having bipolar transistor 18, operating in the common emitter mode, operate transistor 35' in the common base mode to form a cascode circuit having a high impedance at the collector of 35'. The base of transistor 35' is again connected reference resistor 15. Transistor 18 and bipolar transistor 17 are connected together as in the circuit of FIG. 1 to form the same "current mirror" circuit here as there. A further npn bipolar transistor, 45, has its base connected directly to its collector to form a diode-connected transistor connected between resistor 15 and inductor 19 with its effective anode connected to the resistor. Transistor 45 so connected assures base for transistor 35' to keep it active.

Rf signals introduced at input 11 are again amplified by MESFET 16 and passed by capacitor 26 to bipolar transistor 17 for further amplification just as in the circuits of FIGS. 1, 2A and 3A. An alternative to the circuit version shown in FIG. 4 for amplifying such input signals includes shorting inductor 19 and connecting capacitor 26 between inductor 20 and the base of transistor 18 rather than between inductor 20 and the base of transistor 17 as in the circuit of FIG. 3C. Capacitor 30 is connected from the base of transistor 17 rather than from the base of transistor 18. In such an arrangement, the output signal of MESFET 16 can be further amplified by transistor 18 through adding another inductor between the collector of that transistor and the emitter of transistor 35', and moving the connection of capacitor 31 to the collector of transistor 18 from the collector of transistor 17 to capacitively couple to output 12 the signal at the collector of transistor 18.

A further alternative allowing the output signal of MESFET 16 to be amplified by both transistor 18 and transistor 35' is provided by omitting such an added inductor between them. In this last instance, a parallel resonant circuit formed of a capacitor and an inductor must be added between the collector of transistor 35' and the source of MESFET 16, and the signal at the collector of transistor 35' must be capacitively coupled by capacitor 31 to output 12.

The component alternatives mentioned for the components of the circuit of FIG. 1 are also available as alternatives for the components in the circuit alternatives shown in the remaining figures. In addition, the current determining circuits based on bipolar transistors in the figures for providing the operating current to MESFET 16 can be provided by other alternative "current mirroring" circuits.

Although the present invention has been described with reference to preferred embodiments, workers skilled in the art will recognize that changes may be made in form and detail without departing from the spirit and scope of the invention.

What is claimed is:

1. An amplifier for amplifying electrical signals having an input and an output, said amplifier comprising:

a current determiner having an input suited for conducting therethrough selected reference currents which are selectable independently of said electrical signals on said amplifier input and having an output for conducting therethrough corresponding output currents, said current determiner having therein a plurality of controlled circuit devices electrically interconnected in a determiner circuit therein through at least one of which said reference currents are at least in part conducted and through at least one of which said output currents are at least in part conducted such that a said output current has a magnitude selectable by selection of a magnitude for a corresponding reference current, said plurality of controlled circuit devices each having first and second terminating regions and a control region therein by which that said device is capable of being directed, through electrical energization thereof, to effectively provide a conductive path of a selected conductivity between said first and second terminating regions thereof with at least one of said first and second terminating regions of at least one of said controlled circuit devices being electrically connected to said amplifier output; and an input signal receiver having an operating current region electrically connected to said current determiner output, an input electrically coupled to said amplifier input and an output, said input signal receiver having therein an amplifying device through which, at least in part, said current determiner output currents are conducted, said amplifying device having first and second terminating regions and a control region therein by which said amplifying device is capable of being directed, through electrical energization thereof, to effectively provide a conductive path of a selected conductivity between said amplifying device first and second terminating regions, said amplifying device control region being electrically coupled to said input signal receiver input and at least one of said amplifying device first and second terminating regions being electrically connected to said control region of one of said plurality of said controlled circuit devices.

2. The amplifier of claim 1 wherein said plurality of controlled circuit devices are electrically interconnected in said determiner circuit such that one of said plurality of controlled circuit devices through which said reference currents are at least in part conducted has its said control region electrically connected to said control region of one of said plurality of controlled circuit devices through which said output currents are at least in part conducted.

3. The amplifier of claim 1 wherein one of said plurality of controlled circuit devices through which said reference currents are at least in part conducted has its said control region electrically connected to its said first terminating region by an electrical coupler exhibiting an electrical impedance that at least in part increases in magnitude with increasing frequency of signals applied thereto.

4. The amplifier of claim 1 wherein said control region of one of said plurality of said controlled circuit devices to which one of said amplifying device first and second terminating regions is electrically connected as aforesaid also has electrically connected thereto an electrical coupler exhibiting an electrical impedance that at least in part increases in magnitude with increasing frequency of signals applied thereto.

5. The amplifier of claim 1 wherein said one of said plurality of said controlled circuit devices to which one of said amplifying device first and second terminating regions is electrically connected at said control region thereof as aforesaid also has electrically connected to one of first and second terminating regions thereof an electrical coupler exhibiting an electrical impedance that at least in part increases in magnitude with increasing frequency of signals applied thereto.

6. The amplifier of claim 1 wherein said one of said amplifying device first and second terminating regions that is electrically connected to said control region of one of said plurality of said controlled circuit devices is so connected by an electrical coupler exhibiting an electrical impedance that at least in part decreases in magnitude with increasing frequency of signals applied thereto.

7. The amplifier of claim 1 wherein said determiner circuit is electrically connected at a selected location therein to an interconnection means suited for electrical connection to a source of voltage, and wherein that remaining one of said amplifying device first and second terminating regions, other than that one electrically connected to said control region of one of said plurality of said controlled circuit devices, is electrically connected to said interconnection means by an electrical coupler exhibiting an electrical impedance.

8. The amplifier of claim 1 wherein said amplifying device control region is electrically coupled to said input signal receiver input by an impedance matching circuit having an electrical impedance at said input signal receiver input substantially equal to a conjugate of that electrical impedance exhibited by a signal source selected to be electrically connected to said amplifier input.

9. The amplifier of claim 2 wherein said reference currents at least in part pass through each of said electrically connected control regions.

10. The amplifier of claim 3 wherein said plurality of controlled circuit devices are electrically interconnected in said determiner circuit such that one of said plurality of controlled circuit devices through which said reference currents are at least in part conducted has its said control region electrically connected to said control region of one of said plurality of controlled circuit devices through which said output currents are at least in part conducted.

11. The amplifier of claim 4 wherein said plurality of controlled circuit devices are electrically interconnected in said determiner circuit such that one of said plurality of controlled circuit devices through which said reference currents are at least in part conducted has its said control region electrically connected to said control region of one of said plurality of controlled circuit devices through which said output currents are at least in part conducted.

12. The amplifier of claim 5 wherein said plurality of controlled circuit devices are electrically interconnected in said determiner circuit such that one of said plurality of controlled circuit devices through which said reference currents are at least in part conducted has its said control region electrically connected to said control region of one of said plurality of controlled circuit devices through which said output currents are at least in part conducted.

13. The amplifier of claim 6 wherein said plurality of controlled circuit devices are electrically interconnected in said determiner circuit such that one of said plurality of controlled circuit devices through which said reference currents are at least in part conducted has its said control region electrically connected to said control region of one of said plurality of controlled circuit devices through which said output currents are at least in part conducted.

14. The amplifier of claim 7 wherein said plurality of controlled circuit devices are electrically interconnected in said determiner circuit such that one of said plurality of controlled circuit devices through which said reference currents are at least in part conducted has its said control region electrically connected to said control region of one of said plurality of controlled circuit devices through which said output currents are at least in part conducted.

15. The amplifier of claim 8 wherein said plurality of controlled circuit devices are electrically interconnected in said determiner circuit such that one of said plurality of controlled circuit devices through which said reference currents are at least in part conducted has its said control region electrically connected to said control region of one of said plurality of controlled circuit devices through which said output currents are at least in part conducted.

16. The amplifier of claim 9 wherein at least portions of said reference currents passing through said electrically connected control regions are also conducted through a said control region of another said controlled circuit device.

* * * * *

UNITED STATES PATENT AND TRADEMARK OFFICE
CERTIFICATE OF CORRECTION

PATENT NO. : 5,705,953
DATED : JANUARY 6, 1998
INVENTOR(S) : EDWARD A. JESSER

It is certified that error appears in the above-indentified patent and that said Letters Patent is hereby corrected as shown below:

Col. 8, line 27, delete "dram", insert --drawn--

Signed and Sealed this

Thirteenth Day of October 1998

Attest:

BRUCE LEHMAN

Attesting Officer

Commissioner of Patents and Trademarks